United States Patent [19]
Hori

[11] Patent Number: 5,703,407
[45] Date of Patent: Dec. 30, 1997

[54] RESIN-SEALED TYPE SEMICONDUCTOR DEVICE

[75] Inventor: Masahiko Hori, Yokohama, Japan

[73] Assignee: Kabushiki Kaisha Toshiba, Kawasaki, Japan

[21] Appl. No.: 600,261

[22] Filed: Feb. 12, 1996

[30] Foreign Application Priority Data

Feb. 14, 1995 [JP] Japan .................. 7-025166

[51] Int. Cl.$^6$ .............. H01L 23/495; H01L 23/48; H01L 23/28
[52] U.S. Cl. .............. 257/783; 257/787; 257/666
[58] Field of Search .............. 257/783, 787, 257/666, 784, 781, 669, 692, 694, 686

[56] References Cited

U.S. PATENT DOCUMENTS 5,406,124 4/1995 Morita et al. .............. 257/666
5,493,151 2/1996 Asada et al. .............. 257/666

*Primary Examiner*—Mahshid D. Saadat
*Assistant Examiner*—Jhihan B. Clark
*Attorney, Agent, or Firm*—Finnegan, Henderson, Farabow, Garrett & Dunner, L.L.P.

[57] ABSTRACT

In the resin-sealed type semiconductor device of the present invention, the inner lead is adhered onto the semiconductor element via the insulating tape, and electrically connected to the semiconductor element. The inner lead, the insulating tape and the semiconductor element are sealed by resin in a package. The outer lead is integrated with the inner lead to form a step, formed thicker than that of the inner lead, and has an exposed surface in the same plane as the upper surface of the package.

5 Claims, 2 Drawing Sheets

RESIN-SEALED TYPE SEMICONDUCTOR DEVICE

BACKGROUND OF THE INVENTION

1. Field of the Invention

The present invention relates to a resin sealed type semiconductor device having an LOC (lead on chip) structure, and more specifically to a resin-sealed type semiconductor having a high packing density.

2. Description of the Related Art

There are several types of the conventional resin-sealed type semiconductor devices, for example, a QFP (quad flat package) in which an outer lead has a gull wing shape and a PLCC (plastic leaded chip carrier) in which it has a J shape, a TSOP (thin small outline package) and a TQFP (thin quad flat package) in which the thickness of the package is reduced to about 1 mm or less for increasing the package density in terms of space.

FIG. 1 is a cross sectional view showing a resin-sealed type semiconductor device according to a conventional example, which is packed in a circuit substrate.

This resin-sealed type semiconductor device is of a TSOP type in which an outer lead has a gull wing shape. A semiconductor chip 3 is adhered on a chip mounting portion 1 by means of an adhesive 2. This semiconductor chip 3 is electrically connected to an inner lead 5a via a bonding wire 4.

The inner lead 5a, the semiconductor chip 3, the bonding wire 4 and the chip mounting portion 1 are sealed by a mold resin 6. The thickness of the package of this mold resin 6 is about 1 mm.

An outer lead 5b integrated with the inner lead 5a and extended out of the mold resin 6 is formed into a gull wing shape as it is subjected to a predetermined bending process.

The conventional resin-sealed semiconductor device is packed on a circuit substrate 7, and a tip end of the outer lead 5b is electrically connected to wire on the circuit substrate 7 by means of a conductive material 8 such as solder.

The height of the resin-sealed type semiconductor device after thus packed, taken from the surface of the circuit substrate 7 is expressed by $H_1$, and the width of the resin-sealed type semiconductor device, which is for determining the package area, is expressed by $T_1$.

FIG. 2 is a cross sectional view showing a resin-sealed type semiconductor device according to another conventional example, which is packed in a circuit substrate 7.

This resin-sealed type semiconductor device is of an LOC structure in which a large chip is mounted. An insulating tape 9 is provided underneath an inner lead 5a. Underneath this insulating tape 9, a semiconductor chip 3 having a size larger than that of the chip mounted on the first conventional resin-field type semiconductor device, is placed.

This semiconductor chip 3 is electrically connected to an inner lead 5a via a bonding wire 4. The inner lead 5a, the bonding wire 4, the insulation tape 9 and the semiconductor chip 3, are sealed by a mold resin 6.

An outer lead 5b integrated with the inner lead 5a and extended out of the mold resin 6 is formed into a gull wing shape as it is subjected to a predetermined bending process.

The conventional resin-sealed semiconductor device shown in FIG. 2 is packed on a circuit substrate 7, and a tip end of the outer lead 5b is electrically connected to wire on the circuit substrate 7 by means of a conductive material 8 such as solder.

The height of the resin-sealed type semiconductor device after thus packed, taken from the surface of the circuit substrate 7 is expressed by $H_2$, and the width of the resin-sealed type semiconductor device, which is for determining the package area, is expressed by $T_2$.

With regard to the conventional resin-sealed type semiconductor device shown in FIG. 1, the height $H_1$ of the resin-sealed type semiconductor device when packed on the circuit substrate 7 corresponds to that of the J shape of the outer lead 5b, and greatly exceeds 1 mm, which is the thickness of the package 6. The height $H_1$ is determined by the thickness of the package 6 and the height of the outer lead 5b taken from the surface of the circuit substrate 7.

The outer lead 5b extending from the package 6 has a gull wing shape. The package area taken when the resin-sealed type semiconductor device is packed on the circuit substrate 7 cannot be covered by the area of the lower surface of the package 6. Therefore, an area larger than that of the lower surface by the length of an extending portion of the outer lead 5b is necessary. Consequently, in this resin-sealed type semiconductor device, the height $H_1$ cannot be sufficiently reduced, or the packing area cannot be sufficiently reduced.

That is, the resin-sealed type semiconductor device entails a problem in which the requirement for a high packing density cannot be sufficiently satisfied in terms of plane or space.

Further, the conventional resin-sealed type semiconductor device shown in FIG. 2 has an LOC structure. Therefore, even if a large chip is mounted, the width $T_2$ and the height $H_2$ obtained after the package is formed can be made the same as the width $T_1$ and the height $H_1$ of the conventional resin-sealed type semiconductor device shown in FIG. 1, thus making it possible to increase the package density higher than that of the example shown in FIG. 1.

However, in terms of plane or space, the requirement of a high packing density cannot be satisfied due to the shape of the outer lead 5b.

In the conventional resin-sealed type semiconductor device shown in FIGS. 1 or 2, the outer lead 5b projecting from the package 6 is not fixed. Therefore the outer lead 5b is weak to mechanical shock; and the bending of a lead easily occurs.

This is especially true when leads are further finely pitched. In contrast in the conventional J-shaped PLCC, the outer leads have a J shape. The J-shaped PLCC has a structure in which a pocket is provided on the lower surface of the package and the end of an outer lead is bent and put into the pocket, although here it is not shown. Therefore, the bending of leads can be prevented.

However, in the J-shaped PLCC, the pocket must be provided in the lower surface of the package, and therefore the package has to have a certain thickness. Thus, it is difficult to make the package 1 mm or thinner.

SUMMARY OF THE INVENTION

The present invention has been achieved under the above-described circumstances, and the object of the present invention is to provide a resin-sealed type semiconductor device capable of improving the package density in terms of plane and space, in which the bending of leads does not occur even if the pitch between leads is reduced.

In order to achieve the above object, the resin-sealed type semiconductor device includes:

a semiconductor element;

an inner lead adhered onto the semiconductor element via an insulating tape, and electrically connected to the semiconductor element;

a package for sealing the inner lead, the insulation tape and the semiconductor element; and an outer lead, integrated with the inner lead to have a step, formed thicker than that of the inner lead, and having an exposed surface in a same plane as an upper surface of the package.

With the above-described structure, the resin-sealed type semiconductor device of the present invention has a surface on which the shape of an outer lead is exposed, and this surface is situated in substantially the same plane as the upper surface of the package. Therefore, the package density in terms of plane and space can be improved, and even if the pitch between leads is reduced, the bending of leads can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

An embodiment of the present invention will now be described with reference to accompanying drawings.

Figure 3:
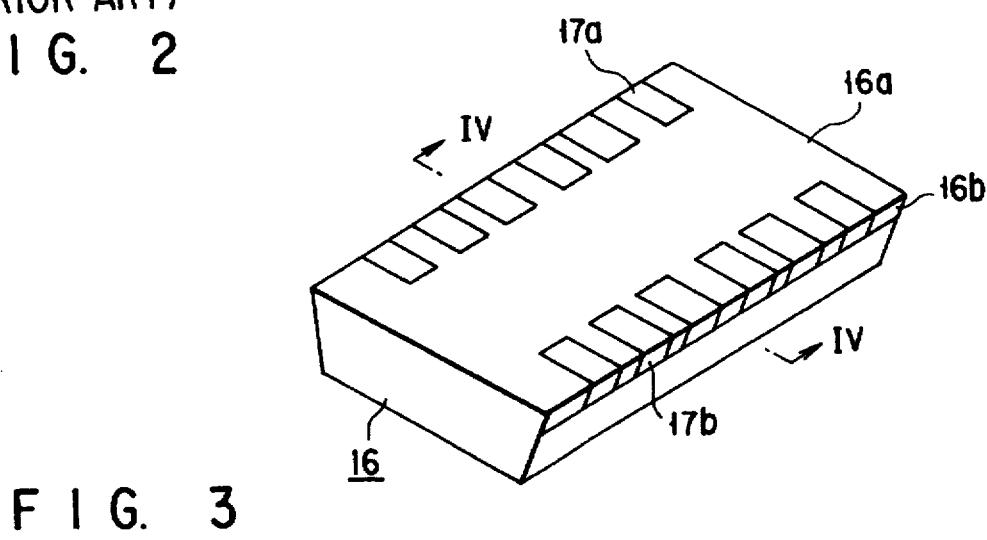
FIG. 3 is a perspective view of a resin-sealed type semiconductor device according to an embodiment of the present invention.
Figure 4:
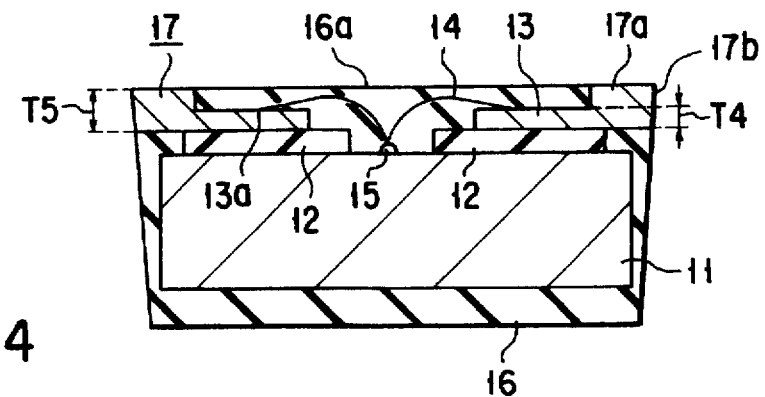
FIG. 4 is a cross sectional view taken along the arrow IV—IV shown in FIG. 3.

As can be seen in FIGS. 3 and 4, on the upper surface of a semiconductor chip 11 having a thickness of about 0.2 mm, an insulating tape 12 having a thickness of about 0.05 mm is adhered. On this insulating tape 12, an inner lead 13 having a thickness $T_4$ of about 0.05 mm is adhered.

The tip end (bonding portion) 13a of the inner lead 13 is electrically connected via a bonding wire 14 such as Au wire, to an electrode pad 15 provided on the upper surface of the semiconductor chip 11. The semiconductor chip 11, the insulating tape 12, the bonding wire 14 and the inner lead 13 are molded by a sealing resin 16 such as an epoxy resin.

The outer lead 17 is integrated with the inner lead 13 to have a step, and the thickness $T_5$ thereof is about 0.15 mm.

Figure 5:
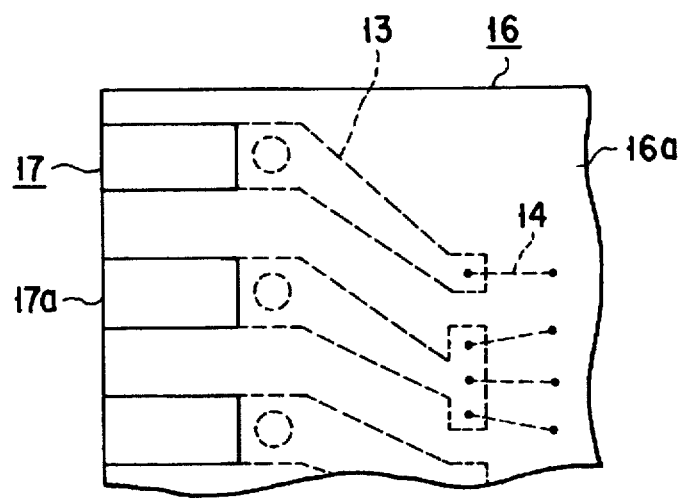
FIG. 5 is a plan view of a part of a resin-sealed type semiconductor device according to the embodiment of the present invention.

After being molded, as can be seen in the partial plan view shown in FIG. 5, the inner lead 13 is covered by the sealing resin 16, and the outer lead 17 is exposed on the same plane as the surface of the sealing resin 16.

In the above embodiment, the bonding wire 14 is shown in the figure; however the present invention is not limited to the bonding wire, the semiconductor chip 11 and the inner lead 13 can be connected to each other via some other conductive material.

Figure 6:
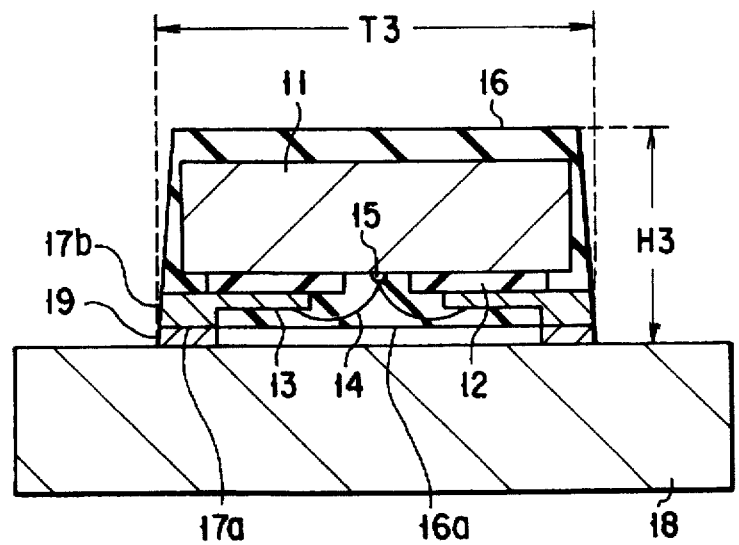
FIG. 6 is a cross sectional view of the resin-sealed type semiconductor device of the present invention shown in FIGS. 3 and 4, which is packed on a circuit substrate.

FIG. 6 is a cross sectional view showing a resin-sealed type semiconductor device of the present invention, which is packed on the circuit substrate.

The surfaces of the outer lead 17 are exposed in the same planes as an upper surface 16a and as a side surface 16b of the package 16. The upper surface 16a of the package 16 and the first surface 17a of the outer lead 17 make substantially the same plane. The side surface 16b of the package 16 and the second surface 17b of the outer lead 17 make substantially the same plane. The second surface 17b can be formed by separating an unnecessary portion of the outer lead 17 after having been sealed.

The lead frame made of the inner lead 13 and the outer lead 17, has a structure having a step by which the outer lead 17 is formed thicker than the inner lead 13.

With the step, the inner lead 13 portion having a reduced thickness is formed by etching the lead frame corresponding to the thickness of the outer lead 17.

The wiring on the circuit substrate 18 and the upper surface 17a of the outer lead 17 are connected by a conductive material 19 such as solder.

The height of the resin-sealed type semiconductor device after thus packed is expressed by, for example, $H_3$, and the width of the resin-sealed type semiconductor device, which is for determining the package area, is expressed by, for example, $T_3$.

In this embodiment, the lead frame having a structure in which the inner lead and the outer lead are integrated with each other with a step, is used, and therefore the upper surface 17a of the outer lead 17 is exposed in the same plane as the upper surface 16a of the package 16.

Consequently, when the resin-sealed type semiconductor device is packed on the circuit substrate 18, the height from the surface of the circuit substrate, created by the outer lead as in the conventional technique, is not necessary.

Further, with the structure in which a step is made in the lead frame, the thickness of the package 16 can be made thinner than the conventional technique.

More specifically, as can be seen in TABLE below, it is understood that the device can be downsized by the present invention, from the comparison between the conventional resin-sealed type semiconductor devices and the device of the present invention.

TABLE

Figure 1:
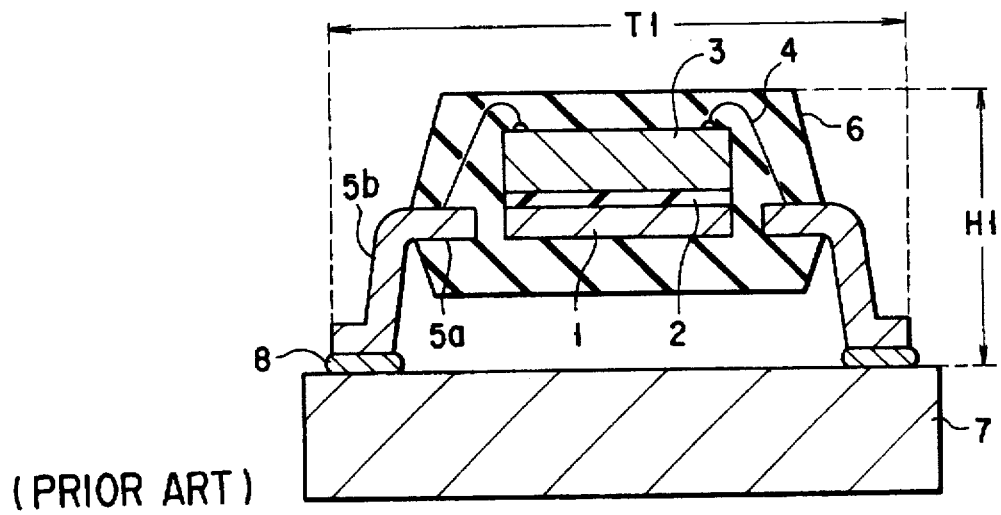
FIG. 1 is a cross section of a resin-sealed type semiconductor device according to a conventional example, which is packed on a circuit substrate.
Figure 2:
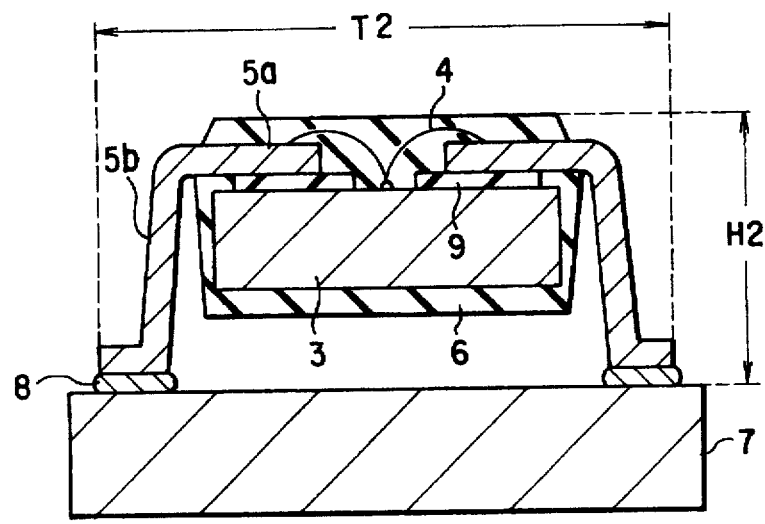
FIG. 2 is a cross section of a resin-sealed type semiconductor device according to another conventional example, which is packed on a circuit substrate.

|  | Conventional device shown in FIG. 1 | Conventional device shown in FIG. 2 | Device of of present invention shown in FIG. 6 |
| --- | --- | --- | --- |
| Package thickness | 1 mm | 1 mm | 0.65 mm |
| Resin-sealed area with respect to chip | 2.2 times (small chip mounted) | 1.3 times (large chip mounted) | 1.3 times (large chip mounted) |

TABLE-continued

|  | Conventional device shown in FIG. 1 | Conventional device shown in FIG. 2 | Device of of present invention shown in FIG. 6 |
| --- | --- | --- | --- |
| Package height | 1.15 mm | 1.15 mm | 0.7 mm |
| Package area | 11.6 mm$^2$ | 11.6 mm$^2$ | 9.1 mm$^2$ |
| Error due to deformation of lead | occurs | occurs | Not occurs |

That is, conventionally, the thickness of the package is about 1 mm, whereas in the present invention, the thickness of the package 16 is about 0.65 mm. Therefore, the height H$_3$ of the device after thus packed can be lowered as compared to the conventional devices.

The height of the conventional device in package is about 1.15 mm, whereas the device of the present invention in package is about 0.7 mm.

As is clear from FIGS. 3, 4 and 6, the side surface 17b of the outer lead 17 is exposed in the same plane as the side surface 16b of the package 16. Therefore, when this resin-sealed type semiconductor device is packed on the circuit substrate 18 shown in FIG. 6, the outer lead does not project out from the package unlike the conventional devices, the packing area can be made smaller than those of the conventional devices. The packing area of each conventional device is about 11.6 mm$^2$, whereas the package area of the device of the present invention is 9.1 mm$^2$.

As described above, the packing density in terms of plane and space can be drastically improved.

Further, the outer lead 17 does not project from the package 16, and therefore the bending of the lead, which easily occurs in the conventional techniques, does not easily occur here. In other words, it is not necessary to draw a long portion of the outer lead 17 from the package 16, and the outer lead 17 is fixed by the resin 16. Therefore, even if the pitch of leads is reduced, the bending of leads, the floating of leads, the deformation of leads such as opening, do not occur.

Further, with the LOC structure, the size of the package 16 can be maintained small even if a large semiconductor chip 11 is sealed by resin. More specifically, in the first conventional resin-sealed semiconductor device, the area of the upper surface of the package must be 2.2 times larger than the area of the upper surface of the mounted semiconductor chip. In the case where the resin-sealed type semiconductor device of the embodiment shown in FIG. 6, the area of the upper surface of the package 16 should only be 1.3 times larger than that of the upper surface of the mounted semiconductor chip 11.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A resin-sealed type semiconductor device comprising:

a semiconductor element having a main surface and a plurality of electrodes arranged on said main surface;

a plurality of leads, each said lead constituted by an inner lead portion and an outer lead portion, bottom surfaces of said inner lead portions being overlapped with and fixed to the main surface of said semiconductor element via an adhesive insulating material, top surfaces of said inner lead portions being respectively electrically connected to said electrodes of said semiconductor element, and top surfaces of said outer lead portions being elevated relative to said top surfaces of said inner lead portions; and a resin package for sealing said semiconductor element, said inner lead portions, and said outer lead portions, while leaving said top surfaces of said outer lead portions exposed in a same plane as a top surface of a portion of said resin package sealing the main surface of said semiconductor element, and side surfaces of said outer lead portions being exposed in flush relation with a peripheral surface of said resin package, such that said plurality of leads do not protrude from said resin package.

2. The device according to claim 1, wherein said side surfaces of said outer lead portions are spaced beyond a side of said semiconductor element by a distance corresponding to a thickness of said resin package sealing the side of said semiconductor element.

3. A resin-sealed type semiconductor device comprising:

a semiconductor element having a main surface and a plurality of electrodes arranged on said main surface;

a plurality of leads, each said lead constituted by an inner lead portion and an outer lead portion, bottom surfaces of said inner lead portions being overlapped with and fixed to the main surface of said semiconductor element via an adhesive insulating material, and top surfaces of said outer lead portions being elevated relative to top surfaces of said inner lead portions; and bonding wires respectively electrically connecting bonding sites on said top surfaces of said inner lead portions to said electrodes of said semiconductor element; and a resin package for sealing said semiconductor element, said inner lead portions, and said outer lead portions, while leaving said top surfaces of said outer lead portions exposed in a same plane as a top surface of a portion of said resin package sealing the main surface of said semiconductor element, and side surfaces of said outer lead portions being exposed in flush relation with a peripheral surface of said resin package, such that said plurality of leads do not protrude from said resin package.

4. The device according to claim 3, wherein said side surfaces of said outer lead portions are spaced beyond a side of said semiconductor element by a distance corresponding to a thickness of said resin package sealing the side of said semiconductor element.

5. The device according to claim 3, wherein portions of said top surfaces of said outer lead portions overlap a portion of said main surface of said semiconductor element main surface.

* * * * *